US012628712B2

(12) United States Patent
Yoo et al.

(10) Patent No.: US 12,628,712 B2
(45) Date of Patent: May 12, 2026

(54) SEMICONDUCTOR PACKAGE HAVING PROTRUSIONS FROM REDISTRIBUTION WIRING LAYER AND METHOD OF MANUFACTURING THE SEMICONDUCTOR PACKAGE

(71) Applicant: SAMSUNG ELECTRONICS CO., LTD., Suwon-si (KR)

(72) Inventors: Jaekyung Yoo, Suwon-si (KR); Woohyeong Kim, Suwon-si (KR); Jinwoo Park, Suwon-si (KR); Juhyeon Oh, Suwon-si (KR); Jayeon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 483 days.

(21) Appl. No.: 18/125,917

(22) Filed: Mar. 24, 2023

(65) Prior Publication Data

US 2024/0079299 A1     Mar. 7, 2024

(30) Foreign Application Priority Data

Sep. 7, 2022    (KR) ........................ 10-2022-0113505

(51) Int. Cl.
*H01L 23/498*        (2006.01)
*H01L 21/48*         (2006.01)
(Continued)

(52) U.S. Cl.
CPC .... *H01L 23/49811* (2013.01); *H01L 21/4857* (2013.01); *H01L 21/56* (2013.01);
(Continued)

(58) Field of Classification Search
CPC ........... H01L 23/49811; H01L 21/4857; H01L 21/56; H01L 23/3128; H01L 23/5383; H01L 24/16
See application file for complete search history.

(56) References Cited

U.S. PATENT DOCUMENTS

| | | | |
|---|---|---|---|
| 9,721,933 B2 | 8/2017 | Chen | |
| 10,290,412 B2 | 5/2019 | Wolter et al. | |
| (Continued) | | | |

FOREIGN PATENT DOCUMENTS

| | | |
|---|---|---|
| JP | 2009-140949 A | 6/2009 |
| JP | 2013-149797 A | 8/2013 |
| (Continued) | | |

OTHER PUBLICATIONS

Communication dated Feb. 2, 2026 issued by the Korean Ministry of Intellectual Property in counterpart Korean Patent Application No. 10-2022-0113505.

*Primary Examiner* — Michael Jung
(74) *Attorney, Agent, or Firm* — Sughrue Mion, PLLC

(57)                ABSTRACT
A semiconductor package includes a first redistribution wiring layer having a first surface and a second surface opposite to the first surface, the first redistribution wiring layer having protrusions protruding from the first surface and a plurality of first bonding pads provided on the protrusions, a first semiconductor device mounted on the first redistribution wiring layer via conductive bumps, a plurality of conductive structures respectively extending from the first bonding pads around the first semiconductor device, and a second redistribution wiring layer disposed on the conductive structures and electrically connected to the first redistribution wiring layer.

20 Claims, 20 Drawing Sheets

(51) Int. Cl.

| | |
|---|---|
| *H01L 21/56* | (2006.01) |
| *H01L 23/00* | (2006.01) |
| *H01L 23/31* | (2006.01) |
| *H01L 23/538* | (2006.01) |
| *H10B 80/00* | (2023.01) |

(52) U.S. Cl.
CPC ...... *H01L 23/3128* (2013.01); *H01L 23/5383* (2013.01); *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01); *H10B 80/00* (2023.02)

(56)     References Cited

U.S. PATENT DOCUMENTS

| | | | |
|---|---|---|---|
| 11,094,634 B2 | 8/2021 | Wang et al. | |
| 2020/0020638 A1* | 1/2020 | Heo | H01L 23/5383 |
| 2020/0161203 A1* | 5/2020 | Kim | H01L 23/49827 |
| 2020/0273804 A1 | 8/2020 | Jeon et al. | |
| 2021/0272913 A1* | 9/2021 | Kim | H01L 23/562 |
| 2021/0398908 A1* | 12/2021 | Jin | H01L 25/105 |
| 2022/0165689 A1 | 5/2022 | Tai et al. | |

FOREIGN PATENT DOCUMENTS

| | | |
|---|---|---|
| KR | 10-2017-0020276 A | 2/2017 |
| KR | 10-2022-0047066 A | 4/2022 |

* cited by examiner

SEMICONDUCTOR PACKAGE HAVING PROTRUSIONS FROM REDISTRIBUTION WIRING LAYER AND METHOD OF MANUFACTURING THE SEMICONDUCTOR PACKAGE

CROSS-REFERENCE TO RELATED APPLICATION

This application claims priority to Korean Patent Application No. 10-2022-0113505, filed on Sep. 7, 2022, in the Korean Intellectual Property Office (KIPO), the contents of which are incorporated by reference herein in its entirety.

BACKGROUND

1. Field

The disclosure relates to a semiconductor package and a method of manufacturing the semiconductor package. More particularly, example embodiments relate to a semiconductor package including a plurality of stacked different semiconductor devices and a method of manufacturing the same.

2. Description of Related Art

In manufacturing a fan-out wafer-level package (FOWLP), a conductive structure (Cu Post) may be used to connect a lower redistribution wiring layer on which a first semiconductor device is mounted and an upper redistribution wiring layer on which a second semiconductor device is mounted. As heights of the conductive structures increase, the deviation of the heights, for example, dispersion may increase, and accordingly a process difficulty and process time may increase.

SUMMARY

One or more example embodiments provide a semiconductor package including a redistribution wiring layer having a structure that reduces process difficulty and process time for forming conductive structures and a method of manufacturing the semiconductor package.

According to an example embodiment, a semiconductor package includes: a first redistribution wiring layer having a first surface and a second surface opposite to the first surface, the first redistribution wiring layer comprising protrusions protruding from the first surface and a plurality of first bonding pads provided on the protrusions; a first semiconductor device mounted on the first redistribution wiring layer via conductive bumps; a plurality of conductive structures respectively extending from the plurality of first bonding pads around the first semiconductor device; and a second redistribution wiring layer disposed on the plurality of conductive structures and electrically connected to the first redistribution wiring layer.

According to an aspect of an example embodiment, a method of manufacturing a semiconductor package includes: forming insulating layers and redistribution wirings on a block layer to form a first redistribution wiring layer comprising protrusions protruding upward; providing a plurality of first bonding pads on the protrusions; forming a plurality of conductive structures that extend from the plurality of first bonding pads, respectively; disposing a first semiconductor device on the first redistribution wiring layer via conductive bumps; forming a molding member on the first semiconductor device and the conductive structure; and forming a second redistribution wiring layer on the molding member to be electrically connected to end portions of the plurality of conductive structures exposed from the molding member.

According to an aspect of an example embodiment, a semiconductor package includes: a first redistribution wiring layer having a first surface and a second surface opposite to the first surface, the first redistribution wiring layer comprising first bonding pads provided in a chip mounting region of the first surface, protrusions protruding from the first surface in an outer region around the chip mounting region, and second bonding pads respectively provided on upper surfaces of the protrusions; a first semiconductor device disposed on the chip mounting region on the first redistribution wiring layer, the first semiconductor device mounted via conductive bumps that are disposed on the first bonding pads; a sealing member on the first surface of the first redistribution wiring layer and disposed on the first semiconductor device; a plurality of conductive structures respectively extending from the second bonding pads to penetrate the sealing member; and a second redistribution wiring layer disposed on the sealing member, the second redistribution wiring layer electrically connected to the plurality of conductive structures.

BRIEF DESCRIPTION OF DRAWINGS

The above and other aspects and features will be more apparent from the following description of example embodiments, taken in conjunction with the accompanying drawings, in which:

FIGS. 3 to 14 are cross-sectional views illustrating a method of manufacturing a semiconductor package in accordance with example embodiments.

FIGS. 16 to 20 are cross-sectional views illustrating a method of manufacturing a semiconductor package in FIG. 15 in accordance with example embodiments.

DETAILED DESCRIPTION OF EXAMPLE EMBODIMENTS

Example embodiments will be described more fully with reference to the accompanying drawings, in which example embodiments are shown. Embodiments described herein are provided as examples, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
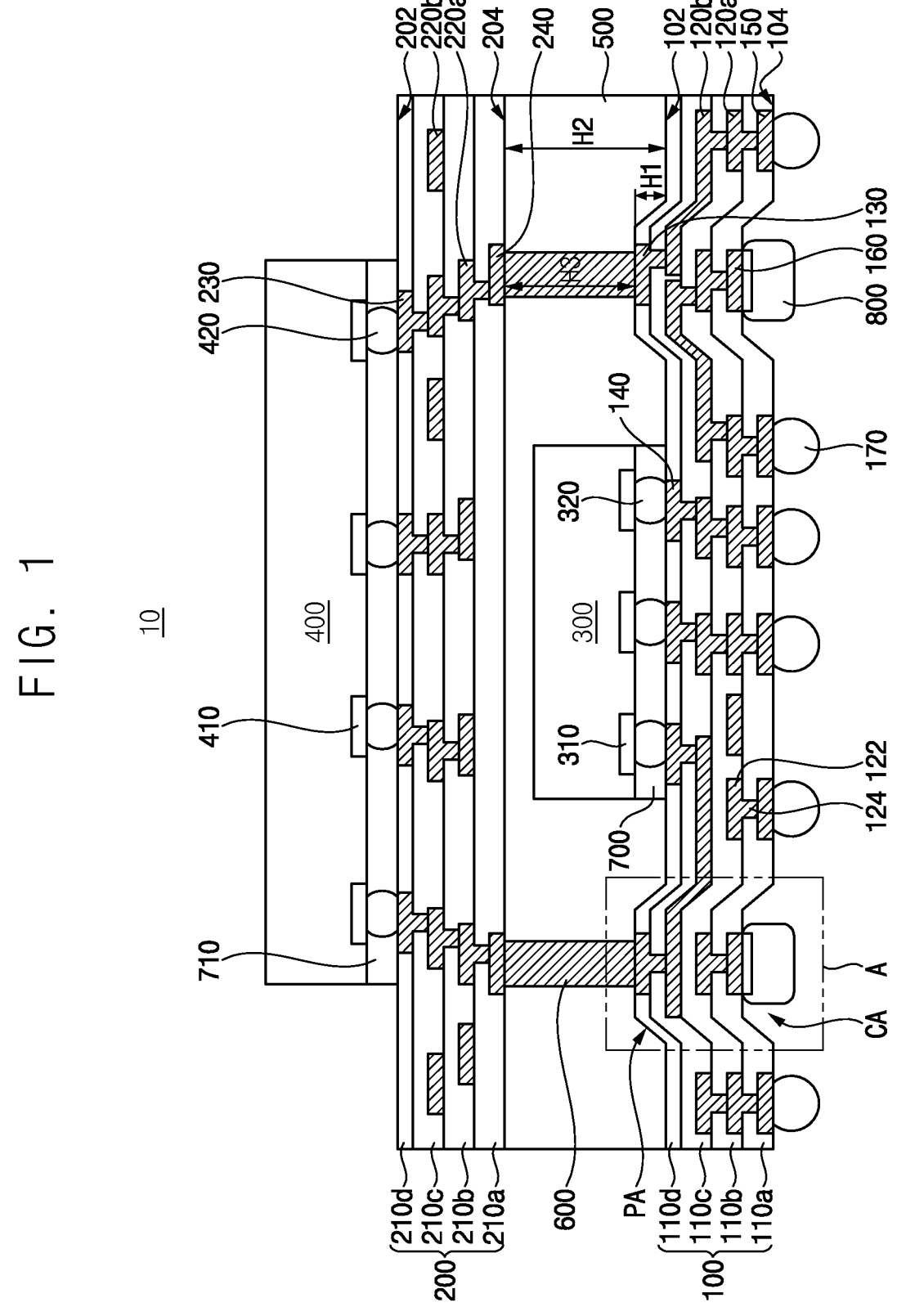
FIG. 1 is a cross-sectional view illustrating a semiconductor package in accordance with example embodiments.
Figure 2:
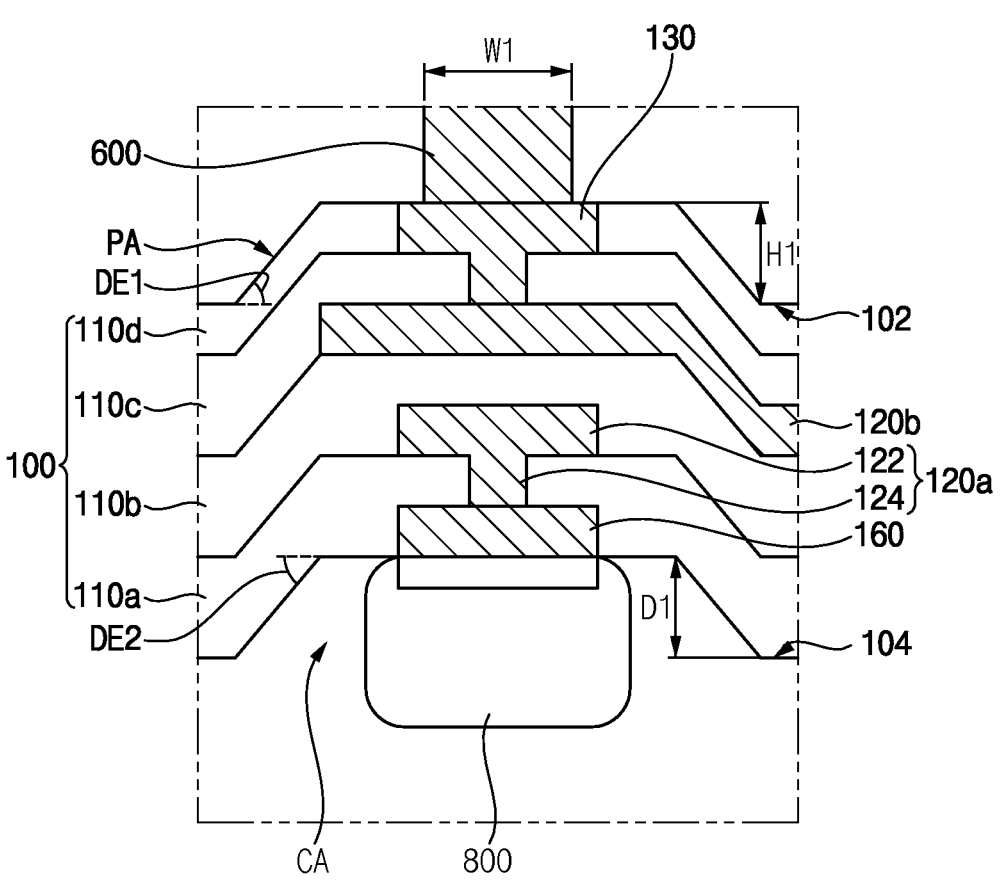
FIG. 2 is an enlarged cross-sectional view illustrating portion 'A' in FIG. 1.

FIG. 1 is a cross-sectional view illustrating a semiconductor package in accordance with example embodiments. FIG. 2 is an enlarged cross-sectional view illustrating portion 'A' in FIG. 1.

Referring to FIGS. 1 and 2, a semiconductor package 10 may include first and second redistribution wiring layers 100 and 200, a first semiconductor device 300 arranged on the first redistribution wiring layer 100, and a conductive structure 600 electrically connecting the first and second redistribution wiring layers 100 and 200 to each other. The semiconductor package 10 may further include a sealing member 500 on the first redistribution wiring layer 100 disposed on and covering the first semiconductor device 300 and first redistribution wiring layer 100. The semiconductor package 10 may further include a second redistribution wiring layer 200 arranged on the sealing member 500, and a second semiconductor device 400 arranged on the second redistribution wiring layer 200.

In example embodiments, the first redistribution wiring layer 100 may include a plurality of first redistribution wirings 120a. The first redistribution wiring layer 100 may include a first surface 102 and a second surface 104 opposite to each other. The first redistribution wiring layer 100 may have a chip mounting region on the first surface 102. The first redistribution wiring layer 100 may include protrusions PA protruding from the first surface 102 and a cavity CA provided in the second surface 104. The first redistribution wiring layer 100 may include a plurality of first and second bonding pads 130 and 140 provided to be exposed on an upper surface of the first redistribution wiring layer 100, that is, the first surface 102, and a plurality of third and fourth bonding pads 150 and 160 provided to be exposed on a lower surface of the first redistribution wiring layer 100, that is, the second surface 104.

In example embodiments, the protrusions PA may protrude from the first surface 102 of the first redistribution wiring layer 100 in an outer region surrounding the chip mounting region. The protrusions PA may protrude from the first surface 102 at a first height H1. For example, the first height H1 may be in a range of from 150 μm to 300 μm. The protrusion PA may have a first sidewall inclined from the first surface 102. The inclined first sidewall may be inclined at a first angle DE1 from the first surface 102. For example, the first angle DE1 may be in a range of from 10 degrees to 45 degrees.

The first bonding pad 130 may be provided on the protrusion PA to be exposed from the first surface 102. As will be described later, the conductive structure 600 may be provided on the first bonding pad 130, and since the protrusion PA protrudes from the first surface 102, a required length of the conductive structure 600 may be reduced.

The first surface 102 of the first redistribution wiring layer 100 may be spaced apart from a fourth surface 204 of the second redistribution wiring layer 200 by a second height H2. The first height H1 of the protrusion PA may be smaller than the second height H2. For example, the second height H2 may be in a range of from 200 μm to 500 μm.

In example embodiments, a bottom surface of the cavity CA may have a first depth D1 from the second surface 104. For example, the first depth D1 may be in a range of from 150 μm to 300 μm. The cavity CA may have a second sidewall inclined from the second surface 104. The inclined second sidewall may be inclined at a second angle DE2 from the second surface 104. For example, the second angle DE2 may be in a range of from 10 degrees to 45 degrees.

The fourth bonding pad 160 may be provided in the bottom surface of the cavity CA. The fourth bonding pad 160 may be exposed from the bottom surface of the cavity CA. As will be described later, an electronic element 800 may be provided on the fourth bonding pad 160. Since the bottom surface of the cavity CA is recessed from the second surface 104, the cavity CA may provide a space for the electronic element 800 to be provided.

In example embodiments, the first redistribution wiring layer 100 may include a plurality of insulating layers 110a, 110b, 110c and 110d and redistribution wirings 120a, 120b provided in the insulating layers. The redistribution wirings may include first and second redistribution wirings 120a and 120b. The insulating layer may include at least one of a polymer or a dielectric layer. The insulating layer may be formed by a vapor deposition process, a spin coating process, or the like. The redistribution wirings may be formed by a plating process, an electroless plating process, a vapor deposition process, or the like.

The redistribution wirings 120a, 120b may electrically connect the first and second semiconductor devices 300 and 400. In example embodiments, there may be more than two redistribution wirings. At least some redistribution wirings 120a, 120b may not extend in a straight manner along a horizontal direction. For example, in an embodiment, at least some redistribution wirings 120a, 120b may extend at varying heights in a thickness direction such that a part of the redistribution wiring is at a different height than another part of the redistribution wiring. For example, at least some redistribution wirings 120a, 120b may be angled or curved in a thickness direction of the first redistribution wiring layer 100 at the protrusion PA or the cavity CA and may extend on the first surface 102.

The redistribution wiring may include a redistribution via 124 provided in an opening that penetrates the insulating layer and a redistribution line 122 stacked on the redistribution via and extending on an upper surface of the insulating layer. For example, the redistribution via 124 may be provided on the redistribution line 122 toward the second surface 104 of the first redistribution wiring layer 100. For example, the semiconductor package 10 may include a chip last structure. The redistribution wirings may include aluminum (Al), copper (Cu), tin (Sn), nickel (Ni), gold (Au), platinum (Pt), or an alloy thereof.

In example embodiments, the insulating layers 110 may be disposed on and cover the redistribution wirings 120. The first insulating layer 110a may be provided on the second surface 104 of the first redistribution wiring layer 100, and the fourth insulating layer 110d (uppermost insulating layer) may be provided on the first surface 102 of the first redistribution wiring layer 100. The insulating layers 110 may be stacked with curves such that the insulating layers are not straight and portions of the insulting layers 110 are at different heights in the thickness direction of the first redistribution wiring layer 100 at the protrusion PA or the cavity CA.

In particular, the plurality of third and fourth bonding pads 150 and 160 may be provided in the first insulating layer 110a. Lower surfaces of the third and fourth bonding pads 150 and 160 may be exposed from the lower surface of the first insulating layer 110a, that is, the second surface 104. The fourth bonding pad 160 may be exposed from the lower surface of the cavity CA. The first insulating layer 110a may have first openings that expose upper surfaces of the third and fourth bonding pads 150 and 160 respectively.

The first redistribution wiring 120*a* may be formed on the first insulating layer 110*a* and may contact the third bonding pad 150 or the fourth bonding pad 160 through the first opening. The first redistribution wiring 120*a* may extend to have the curves in the thickness direction of the first redistribution wiring layer 100 from the protrusion PA or the cavity CA. The second insulating layer 110*b* may be formed on the first insulating layer 110*a* and may have a second opening that exposes the first redistribution wiring 120*a*.

The second redistribution wiring 120*b* may be formed on the second insulating layer 110*b* and may contact the first redistribution wiring 120*a* through the second opening. The second redistribution wiring 120*b* may extend to have the curve in the thickness direction of the first redistribution wiring layer 100 from the protrusion PA or the cavity CA such that the second redistribution wiring 120*b* has a varying height such that at least the second redistribution wiring 120*b* partially conforms to the shape of the protrusion PA or the cavity CA and some portions of the second redistribution wiring 120*b* are at a different height than other portions. The third insulating layer 110*c* may be formed on the second insulating layer 110*b* and may have a third opening that exposes the second redistribution wiring 120*b*.

The first and second bonding pads 130 and 140 may be formed on the third insulating layer 110*c* and may contact the second redistribution wiring 120*b* through the third opening. The fourth insulating layer 110*d* may be formed on the third insulating layer 110*c* and may have fourth openings that expose the first and second bonding pads 130 and 140, respectively. Accordingly, the first and second bonding pads 130 and 140 may be exposed from an upper surface of the fourth insulating layer 110*d*, that is, the first surface 102.

In example embodiments, the first redistribution wiring layer 100 may be connected to other semiconductor devices through solder bumps 170 as conductive connection members. The solder bumps 170 may be formed on the third bonding pads 150. For example, the solder bumps 170 may include C4 bumps. The third bonding pads 150 of the first redistribution wiring layer 100 may be electrically connected to substrate pads of a package substrate by the solder bumps 170.

In example embodiments, the first semiconductor device 300 may be disposed on the first redistribution wiring layer 100. The first semiconductor device 300 may be mounted on the chip mounting region of the first redistribution wiring layer 100. The first semiconductor device 300 may be mounted on the first redistribution wiring layer 100 by a flip chip bonding method. In the example embodiment, the first semiconductor device 300 may be mounted on the first redistribution wiring layer 100 such that an active surface on which first chip pads 310 are formed faces the first redistribution wiring layer 100. The first chip pads 310 of the first semiconductor device 300 may be electrically connected to the second bonding pads 140 of the first redistribution wiring layer 100 by first conductive bumps 320 as conductive connecting members. For example, the first conductive bumps 320 may include micro bumps (uBumps).

A first adhesive member 700 may be provided between the first redistribution wiring layer 100 and the first semiconductor device 300. For example, the first adhesive member 700 may include an epoxy material.

In example embodiments, the sealing member 500 may cover the first redistribution wiring layer 100, the first semiconductor device 300 and the conductive structures 600. The sealing member 500 may be provided on the first redistribution wiring layer 100 to fill a space between the first and second redistribution wiring layers 100 and 200. The sealing member 500 may include a plurality of through openings through which the conductive structures 600 extend respectively. One end portion of the conductive structure 600 within the through opening may be connected to the first bonding pad 130 of the first redistribution wiring layer 100, and the other end portion of the conductive structure 600 may be connected to a sixth bonding pad 240 of the second redistribution wiring layer 200.

The second redistribution wiring layer 200 may be disposed on an upper surface of the sealing member 500. The sealing member 500 may have the even upper surface on which the second redistribution wiring layer 200 is disposed. For example, the sealing member 500 may include an epoxy molding compound (EMC).

In example embodiments, the electronic element 800 may be bonded to the fourth bonding pad 160 of the first redistribution wiring layer 100. The electronic element 800 may be bonded to the fourth bonding pad 160 that is exposed from the bottom surface of the cavity CA, via electrodes. The electronic element 800 may be accommodated into the cavity CA recessed from the second surface 104 of the first redistribution wiring layer 100. For example, the electronic element may perform various functions as a surface mount device. The electronic element may include an active device, a passive device, and a semiconductor chip.

In example embodiments, the conductive structure 600 may penetrate the sealing member 500 in a vertical direction to electrically connect the first redistribution wiring layer 100 and the second redistribution wiring layer 200. The conductive structure 600 may be provided on the first redistribution wiring layer 100. The conductive structure 600 may be provided outside the first semiconductor device 300. The conductive structure 600 may extend from the first redistribution wiring layer 100 in the vertical direction same as the thickness direction of the first redistribution wiring layer 100.

In particular, the conductive structure 600 may be electrically connected to the first bonding pad 130 of the first redistribution wiring layer 100. The first bonding pad 130 may be exposed from an upper surface of the protrusion PA. The conductive structure 600 may extend in the vertical direction from the first bonding pad 130 that is provided on the protruding portion PA of the first redistribution wiring layer 100. The conductive structure 600 may be electrically connected to the sixth bonding pad 240 of the second redistribution wiring layer 200. The conductive structure 600 may provide a signal transmission path for electrically connection between the first and second redistribution wiring layers 100 and 200.

The conductive structure 600 may have a third height H3. Since the conductive structure 600 extends in the vertical direction from the protrusion PA of the first redistribution wiring layer 100, the third height H3 of the conductive structure 600 may be smaller than the second height H2 that is a spacing distance between the first and second redistribution wiring layers 100 and 200. The sum of the first height H1 of the protrusion PA and the third height H3 of the conductive structure 600 may be equal to the second height H2 that is the spacing distance between the first and second redistribution wiring layers 100 and 200. As the first height H1 of the protrusion PA increases, the third height H3 of the conductive structure 600 may decrease.

For example, the conductive structure 600 may include a pillar shape or a bump shape. The conductive structure 600 may include nickel (Ni), antimony (Sb), bismuth (Bi), zinc (Zn), indium (In), palladium (Pd), platinum (Pt), aluminum (Al), and copper (Cu), molybdenum (Mo), titanium (Ti), gold (Au), silver (Ag), chromium (Cr), and tin (Sn). The conductive structure 600 may be formed by a plating process, an electroless plating process, a vapor deposition process, or the like.

In example embodiments, the second redistribution wiring layer (upper redistribution wiring layer) 200 may have a third surface 202 and a fourth surface 204 opposite to each other. The second redistribution wiring layer 200 may include a plurality of fifth bonding pads 230 that are exposed from the third surface 202 and a plurality of the sixth bonding pads 240 that are exposed from the fourth surface 204. The second redistribution wiring layer 200 may be disposed on the first redistribution wiring layer 100 through the conductive structure 600. The second semiconductor device 400 may be disposed on the second redistribution wiring layer 200.

The second redistribution wiring layer 200 may be electrically connected to the first redistribution wiring layer 100 through the conductive structure 600 that is electrically connected to the sixth bonding pad 240. The conductive structure 600 may be electrically connected to the first bonding pads 130 of the first redistribution wiring layer 100. The conductive structure 600 may penetrate the sealing member 500 to electrically connect the second redistribution wiring layer 200 and the first redistribution wiring layer 100.

In example embodiments, the second redistribution wiring layer 200 may include a plurality of insulating layers 210a, 210b, 210c and 210d and redistribution wirings 220 provided in the insulating layers. The redistribution wirings 220 may include third and fourth redistribution wirings 220a and 220b.

In particular, the plurality of fifth bonding pads 230 may be provided in an eighth insulating layer (uppermost insulating layer) 210d. An upper surface of the fifth bonding pad 230 may be exposed from an upper surface of the eighth insulating layer 210d, that is, the third surface 202. The eighth insulating layer 210d may have an eighth opening that exposes an upper surface of the fifth bonding pad 230.

The plurality of sixth bonding pads 240 may be provided in the fifth insulating layer 210a. A lower surface of the sixth bonding pad 240 may be exposed from a lower surface of the fifth insulating layer 210a, that is, the fourth surface 204. The fifth insulating layer 210a may have a fifth opening that exposes the lower surface of the sixth bonding pad 240.

The third redistribution wiring 220a may be formed on the fifth insulating layer 210a and may contact the sixth bonding pad 240 through the fifth opening. The sixth insulating layer 210b may be formed on the fifth insulating layer 210a and may have a sixth opening that exposes the third redistribution wiring 220a.

The fourth redistribution wiring 220b may be formed on the sixth insulating layer 210b and may contact the third redistribution wiring 220a through the sixth opening. The seventh insulating layer 210c may be formed on the sixth insulating layer 210b and may have a seventh opening that exposes the fourth redistribution wiring 220b.

The fifth bonding pad 230 may be formed on the seventh insulating layer 210c and may contact the fourth redistribution wiring 220b through the seventh opening. The fifth bonding pad 230 may be formed in the eighth insulating layer 210d and exposed from the eighth insulating layer 210d through the eighth opening. Accordingly, the plurality of fifth bonding pads 230 may be exposed from the upper surface of the eighth insulating layer 210d, that is, the third surface 202.

In example embodiments, the second semiconductor device 400 may be disposed on the second redistribution wiring layer 200. The second semiconductor device 400 may be mounted on the second redistribution wiring layer 200 by a flip chip bonding method. In this case, the second semiconductor device 400 may be mounted on the second redistribution wiring layer 200 such that an active surface on which second chip pads 410 are formed faces the second redistribution wiring layer 200.

The second chip pads 410 of the second semiconductor device 400 may be electrically connected to the fifth bonding pads 230 of the second redistribution wiring layer 200 by second conductive bumps 420 as conductive connection members. For example, the second conductive bumps 420 may include micro bumps (uBumps).

A second adhesive member 710 may be provided between the second redistribution wiring layer 200 and the second semiconductor device 400. For example, the second adhesive member 710 may include an epoxy material.

Although an example embodiment illustrates one first semiconductor device 300 and one second semiconductor device 400 example embodiments are not limited thereto. For example, there may be more than one first semiconductor device 300 and one second semiconductor device 400. In an example embodiment, the second semiconductor device 400 may include a buffer die and a plurality of memory dies (chips) sequentially stacked on the buffer die.

Although only some substrates, some bonding pads, and some wirings are illustrated in the example embodiment shown in the drawings, it may be understood that the number and arrangement of the substrates, the bonding pads, and the wirings are exemplary, and it may be not limited thereto. Since the wirings as well as the substrates are well known in the art to which the present embodiments pertain, illustration and description concerning the above elements may be omitted.

As mentioned above, the protrusions provided PA on the first redistribution wiring layer 100 may reduce the distance between the first and second redistribution wiring layers 100 and 200. Since each of the conductive structures 600 extends from first bonding pads 130 exposed from the protrusion PA, a height required for the conductive structures 600 may be reduced. Since the required heights of the conductive structures 600 are reduced, a process time in a plating process for forming the conductive structures 600 may be shortened. In the process of forming the protrusions PA, space utilization may be increased through the cavity CA formed on the second surface 104 of the first redistribution wiring layer 100.

Hereinafter, a method of manufacturing the semiconductor package according to the example embodiment in FIG. 1 will be described.

FIGS. 3 to 14 are cross-sectional views illustrating a method of manufacturing a semiconductor package in accordance with example embodiments.

Figure 3:
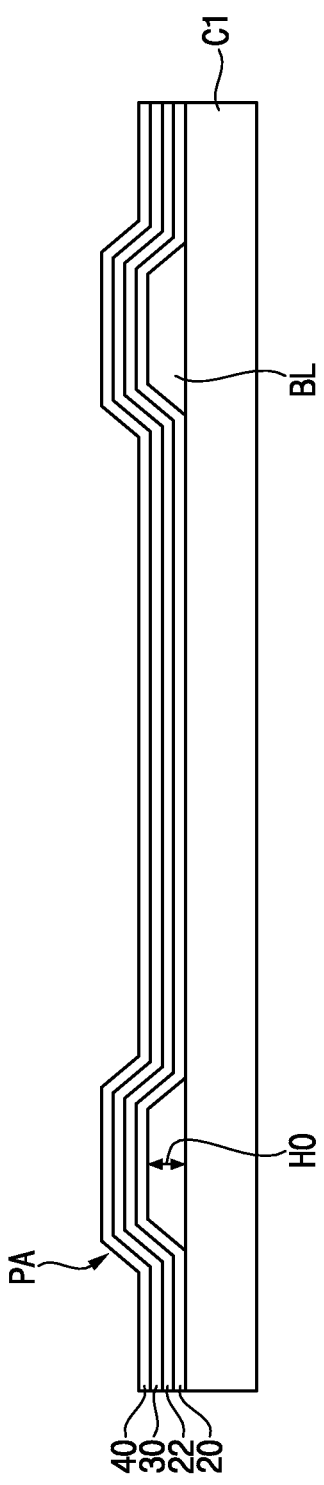
Figure 4:
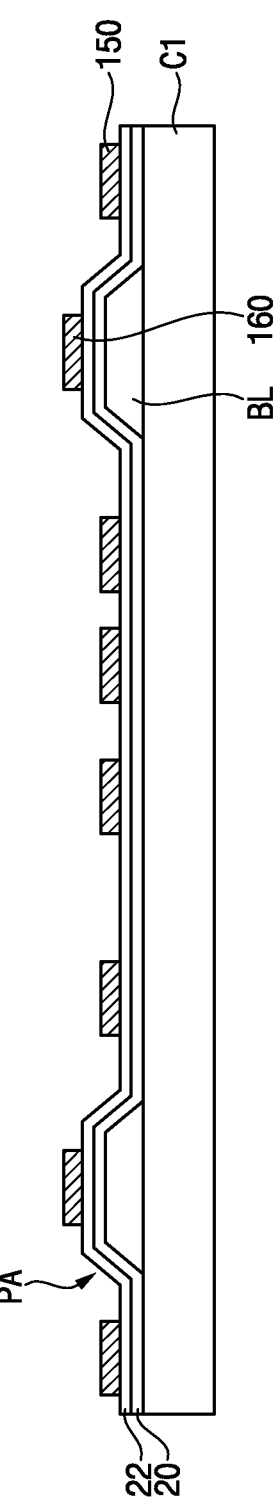
Figure 5:
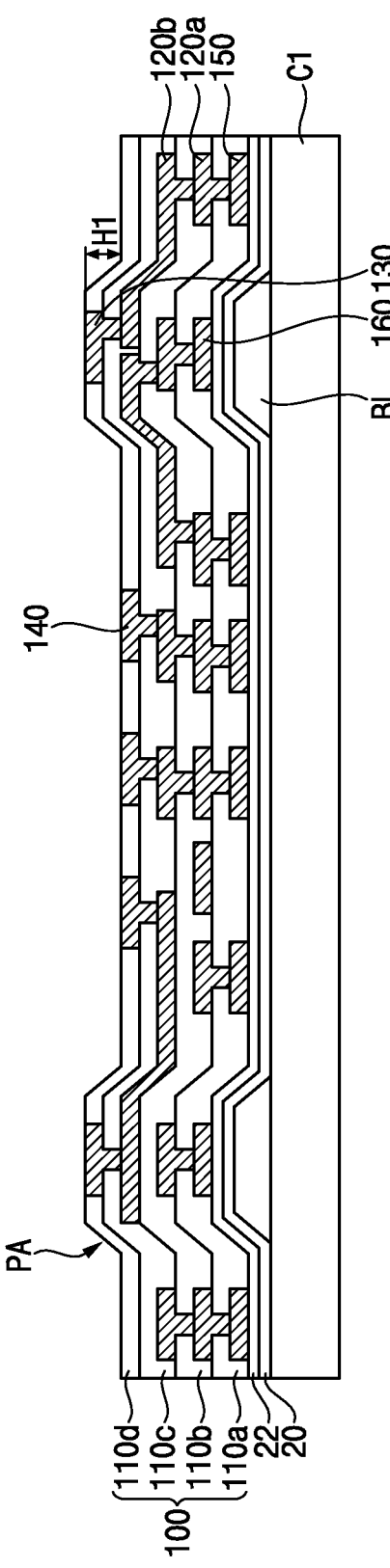
Figure 6:
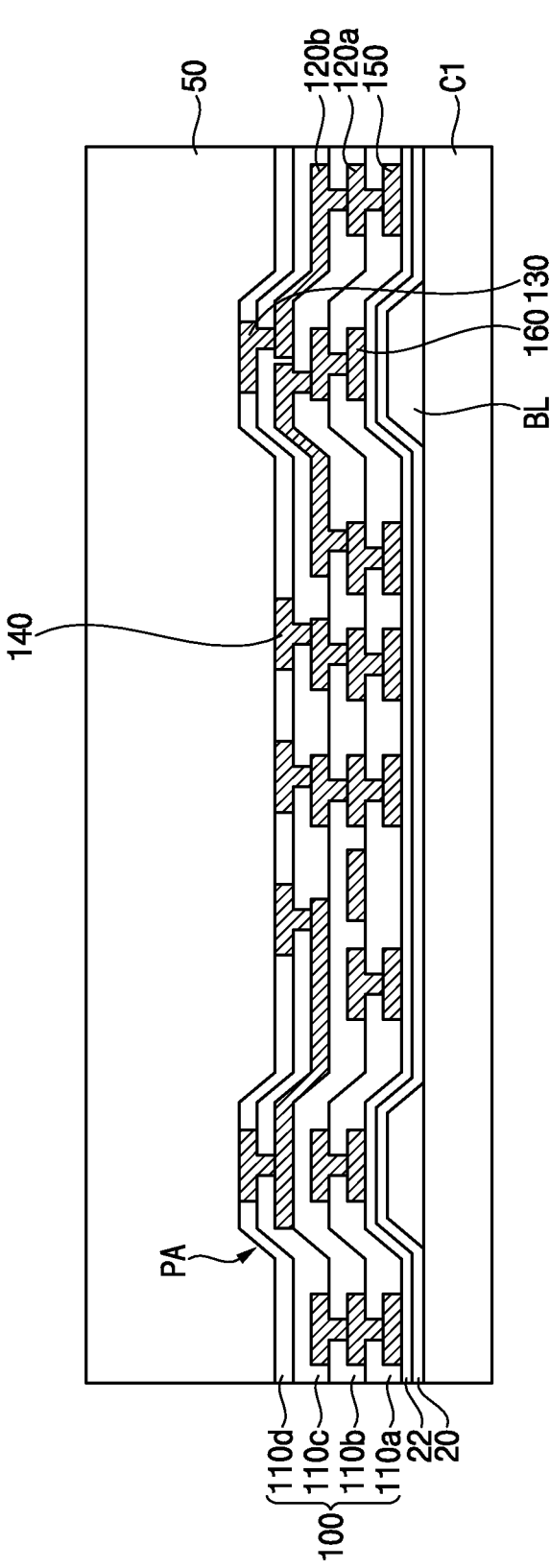
Figure 7:
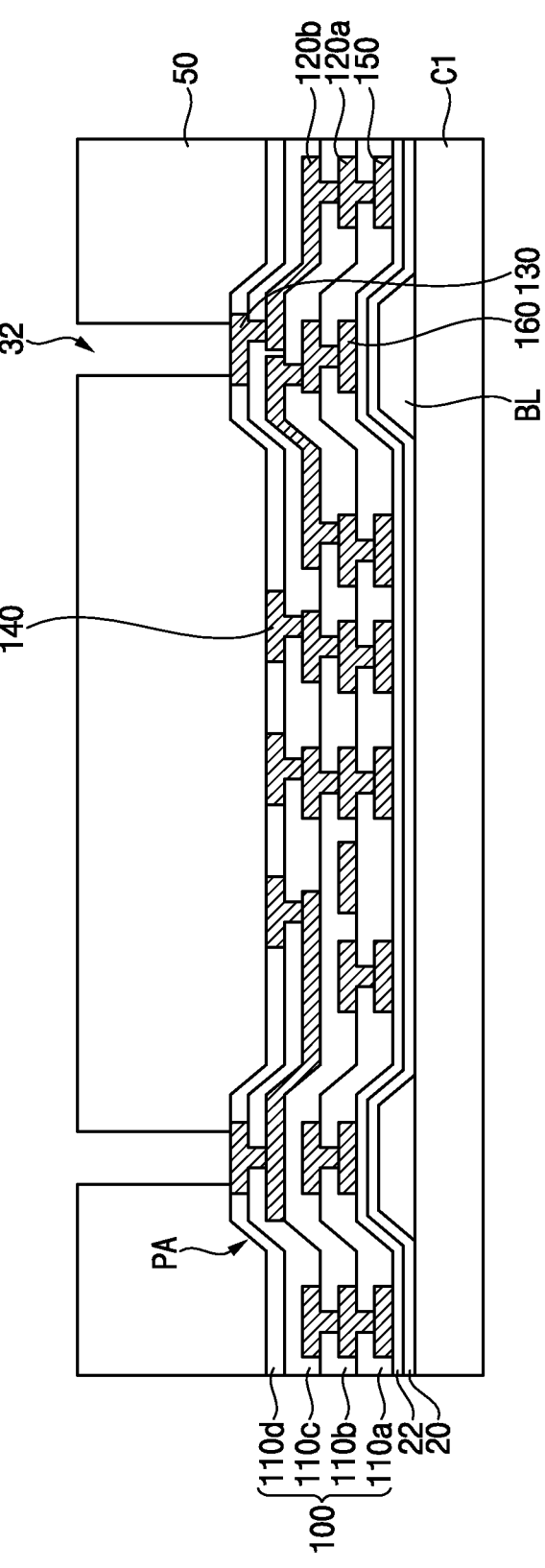
Figure 8:
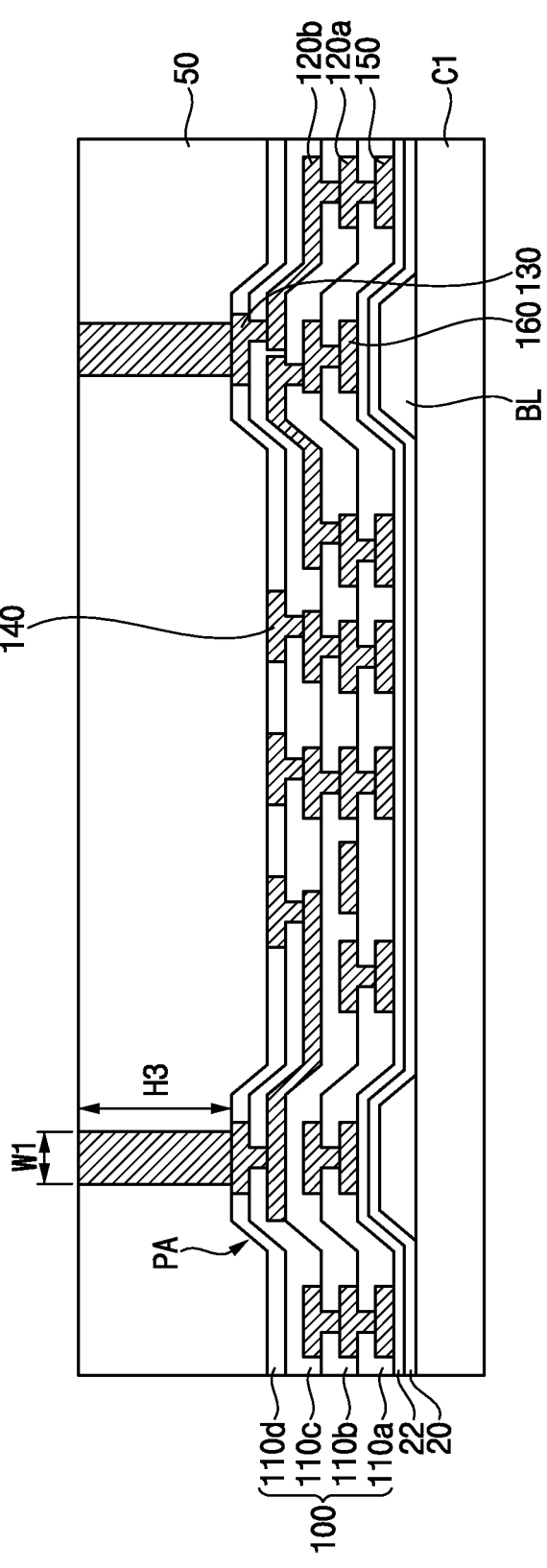
Figure 9:
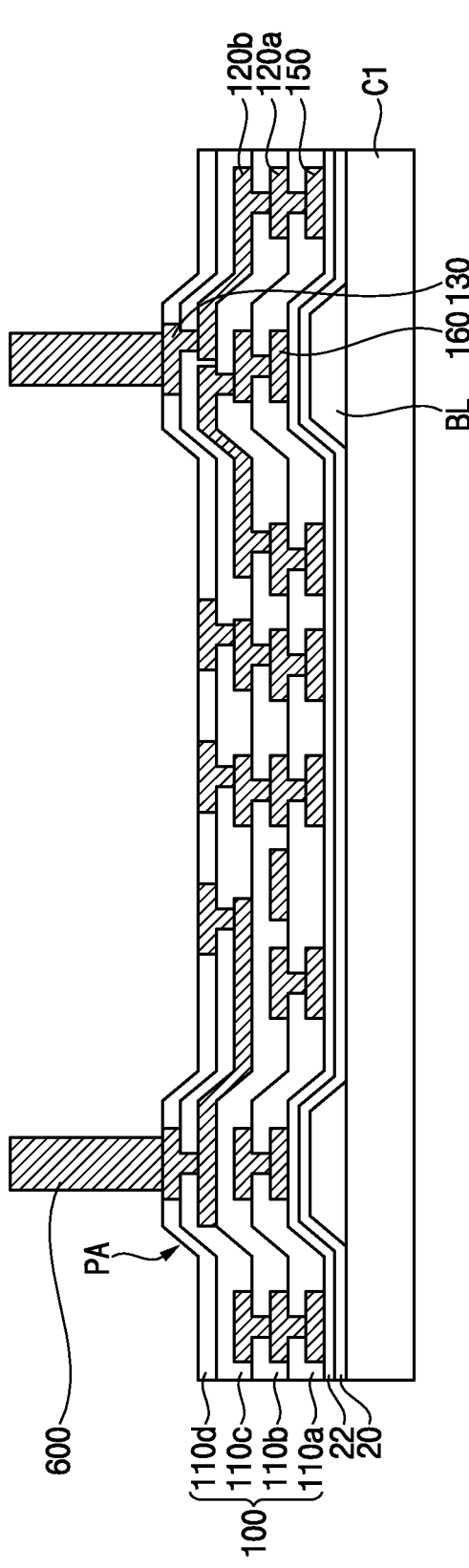

Referring to FIGS. 3 to 5, first, a block layer may be formed on a carrier substrate C1 and a first redistribution wiring layer 100 may be formed on the block layer.

As illustrated in FIGS. 3 and 4, the block layer, a release tape 20, a barrier metal layer 22, a seed layer 30 and a first photoresist film 40 may be sequentially formed on the carrier substrate C1.

The block layer may include a plurality of blocks BL. The blocks BL may be formed on the carrier substrate C1. The blocks BL may be formed on the carrier substrate C1 at locations where first bonding pads 130 for forming conductive structures 600 (see FIG. 9) are to be provided. The block BL may be disposed at a location for forming a protrusion PA or a cavity CA. The block BL may have a predetermined height H0. For example, the predetermined height H0 may be in a range of from 150 μm to 300 μm.

The seed layer 30 may include copper (Cu), aluminum (Al), titanium (Ti), or an alloy thereof. The seed layer 30 may be formed by a sputtering process.

Then, an exposure process may be performed on the first photoresist film 40 to form a first photoresist pattern having first temporary openings that expose regions of third and fourth bonding pads 150 and 160. Then, a first plating process may be performed on the seed layer 30 to form a first metal pattern.

Then, the first photoresist pattern may be removed to form a first preliminary bonding pad having a first metal pattern on the seed layer 30, and a portion of the first metal pattern may be selectively removed to form the third and fourth bonding pads 150 and 160.

As illustrated in FIG. 5, the first redistribution wiring layer 100 having first redistribution wirings 120a that are electrically connected to the first to fourth bonding pads 130, 140, 150 and 160 may be formed.

First, after a first insulating layer 110a is formed on the barrier metal layer 22 to cover the third and fourth bonding pads 150 and 160, the first insulating layer 110a may be patterned to form first openings that expose the third and fourth bonding pads 150 and 160. The first insulating layer 110a may extend and may be curved in a thickness direction of the first redistribution wiring layer 100 by the blocks BL.

For example, the first insulating layer 110a may include a polymer or a dielectric layer. In particular, the first insulating layer 110a may include polyimide (PI), lead oxide (PbO), polyhydroxystyrene (PHS), novolac, or the like. The first insulating layer 110a may be formed by a vapor deposition process, a spin coating process, or the like.

A first redistribution wiring 120a may be formed on the first insulating layer 110a to directly contact the first and second bonding pads 130 and 140 through the first openings. At least some of the first redistribution wiring 120a may extend with curves formed by the blocks BL.

After a seed layer is formed on a portion of the first insulating layer 110a and in the first opening, the seed layer may be patterned and an electroplating process may be performed to form the first redistribution wiring 120a. Accordingly, at least a portion of the first redistribution wiring 120a may directly contact the third and fourth bonding pads 150 and 160 through the first opening.

For example, the first redistribution wiring may include aluminum (Al), copper (Cu), tin (Sn), nickel (Ni), gold (Au), platinum (Pt), or an alloy thereof.

Then, after a second insulating layer 110b is formed on the first insulating layer 110a to cover the first redistribution wirings 120a, the second insulating layer 110b may be patterned to form a second opening that exposes the first redistribution wiring 120a. A second redistribution wiring 120b may be formed on the second insulating layer 110b to directly contact the first redistribution wiring 120a through the second opening. At least a portion of the second insulating layer 110b may extend with the curves formed by the blocks BL. At least some of the second redistribution wirings such as 210a, 210b, 210c, 210d may extend with the curves formed by the blocks BL.

Then, after a third insulating layer 110c is formed on the second insulating layer 110b to cover the second redistribution wirings 120b, the third insulating layer 110c may be patterned to form a third opening that exposes the second redistribution wiring 120b. The first and second bonding pads 130 and 140 may be formed on the third insulating layer 110c to directly contact the second redistribution wirings 120b through the third openings. At least a portion of the third insulating layer 110c may extend with the curve formed by the blocks BL.

Then, after a fourth insulating layer 110d is formed on the third insulating layer 110c to cover the first and second bonding pads 130 and 140, the fourth insulating layer 110d may be patterned to form fourth openings that expose the first and second bonding pads 130 and 140.

The protrusion PA may be formed on a first surface 102 of the first redistribution wiring layer 100 by the underlying blocks BL. The protrusion PA may protrude from the first surface 102 at a first height H1. The first height H1 of the protrusion PA may be the same as the predetermined height H0 of the block BL.

Referring to FIGS. 6 to 9, according to an example embodiment, a plurality of the conductive structures 600 may be formed on the first redistribution wiring layer 100.

First, a second photoresist film 50 may be formed on the first surface 102 of the first redistribution wiring layer 100. The second photoresist film 50 may be disposed on and cover the first and second bonding pads 130 and 140 that are exposed from the first surface 102 of the first redistribution wiring layer 100.

Then, an exposure process may be performed on the second photoresist film 50 to form through openings 32 that expose the first bonding pads 130.

The conductive structures 600 may be formed to fill the through openings 32 that penetrate the second photoresist film 50 in a vertical direction. The through openings 32 may be filled up with conductive material by a second plating process to form the conductive structures 600. For example, the conductive structure 600 may be formed by a plating process, an electroless plating process, a vapor deposition process, or the like. The conductive structure 600 may include a pillar shape, a bump shape, and the like.

Then, the second photoresist film 50 may be removed to form the conductive structures 600 that extend from the first bonding pads 130, respectively. Alternatively, after a sealing member 500 is formed on the first surface 102 of the first redistribution wiring layer 100, the through openings may be formed to penetrate the sealing member 500 in the vertical direction, and the conductive structures 600 may be formed in the through openings.

The conductive structures 600 may be formed to have a third height H3 from the protrusion PA of the first redistribution wiring layer 100. The conductive structures 600 may be formed to have the third height H3 from the first bonding pad 130 exposed from the protrusion PA.

Since the conductive structure 600 extends in the vertical direction from the protrusion PA of the first redistribution wiring layer 100, a required height required for the conductive structure 600 may be reduced by the protrusion PA. As the first height H1 of the protrusion PA increases, the third height H3 of the conductive structure 600 may decrease. Since the third height H3 of the conductive structure 600 is reduced, manufacturing cost and manufacturing time of the conductive structure 600 may be reduced.

The conductive structures 600 may be formed to have a first diameter W1. The third height H3 of the conductive structure 600 may be in a range of from 50 μm to 200 μm. The first diameter W1 of the conductive structure 600 may be in a range of from 50 μm to 200 μm.

Figure 10:
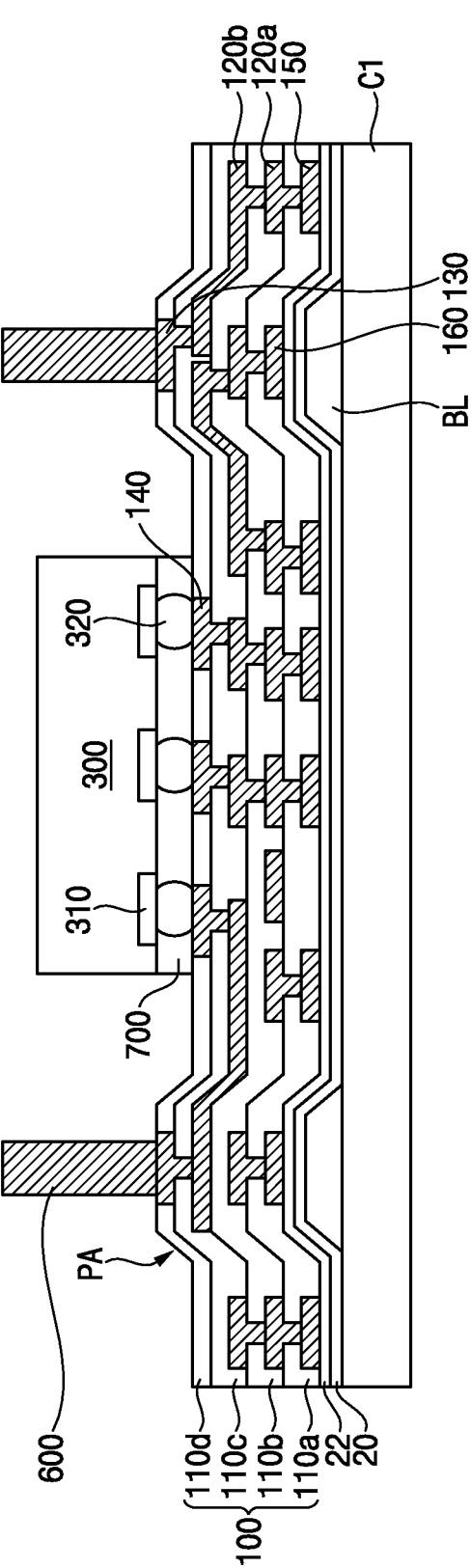
Figure 11:
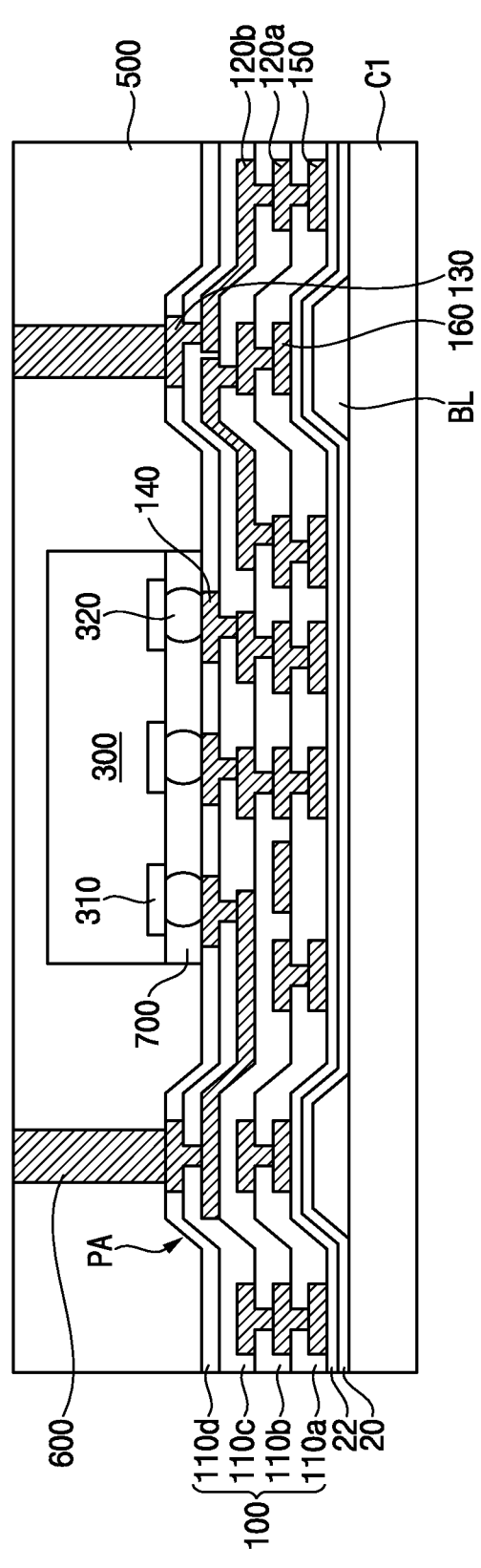

Referring to FIGS. 10 to 11, after the first semiconductor device 300 is mounted on the first redistribution wiring layer 100, the sealing member 500 may be formed on the first redistribution wiring layer 100 to be disposed on and cover the first semiconductor device 300 and the conductive structures 600.

In example embodiments, the first semiconductor device 300 may be mounted on the first redistribution wiring layer 100 by a flip chip bonding method. First chip pads 310 of the first semiconductor device 300 may be electrically connected to the second bonding pads 140 of the first redistribution wiring layer 100 by first conductive bumps 320. For example, the first conductive bumps 320 may include micro bumps (uBumps).

For example, the sealing member 500 may include an epoxy molding compound (EMC). The sealing member 500 may be formed to expose an upper surface of the conductive structure 600.

An upper surface of the sealing member 500 may be partially removed by a grinding process such as a chemical mechanical polishing (CMP) process. Accordingly, a thickness of the sealing member 500 may be reduced to a desired thickness. One end portion of the conductive structure 600 may be exposed from the upper surface of the sealing member 500.

Figure 12:
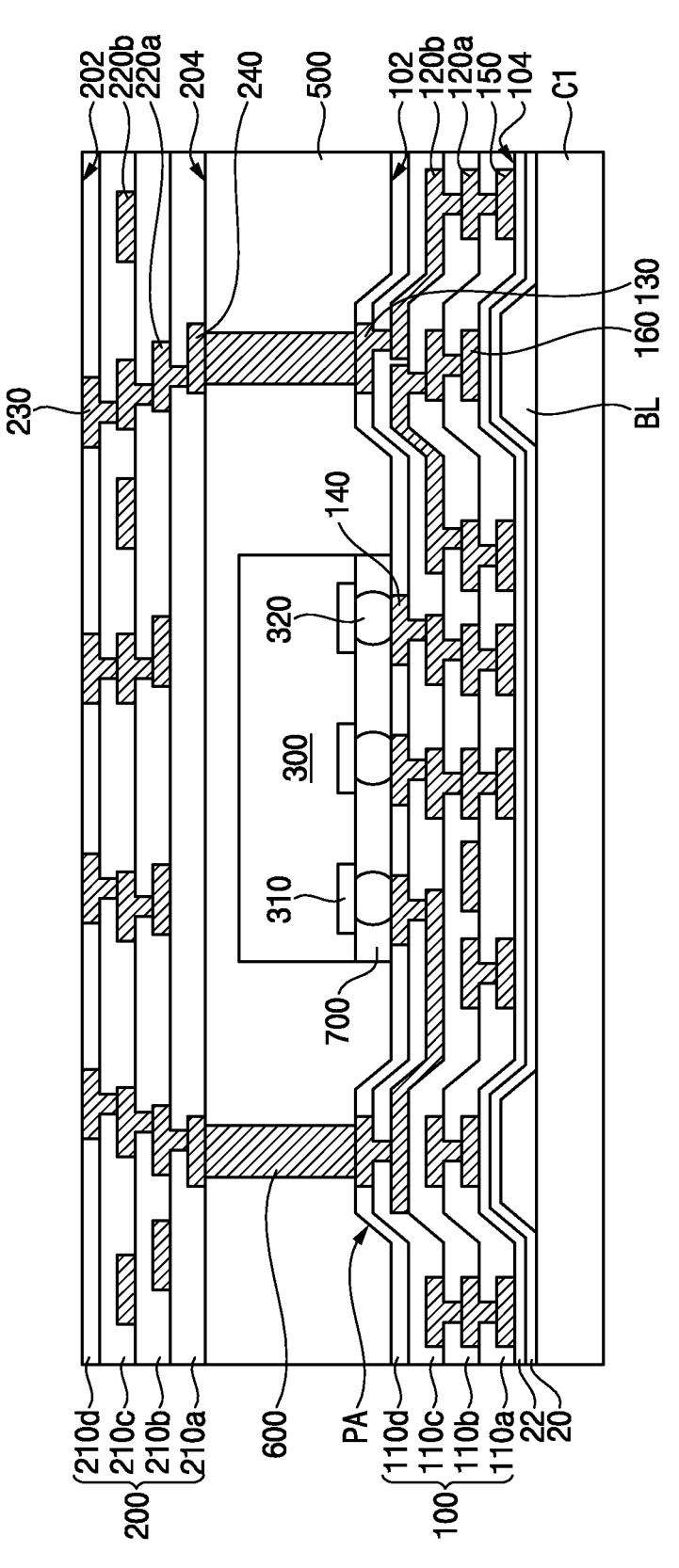

Referring to FIG. 12, processes the same as or similar to the processes described with reference to FIGS. 4 and 5 may be performed to form a second redistribution wiring layer 200.

First, a third photoresist film may be formed on the sealing member 500, and an exposure process may be performed on the third photoresist film to form a third photoresist pattern having a third temporary opening exposing a region of a sixth bonding pad 240. Then, a third plating process may be performed to form a third metal pattern.

Then, the third photoresist pattern may be removed to form a third preliminary bonding pad including the third metal pattern, and a portion of the third metal pattern may be selectively removed to form the sixth bonding pad 240. The sixth bonding pad 240 may be formed on the conductive structure 600.

Then, after a fifth insulating layer 210a is formed on the sealing member 500 to cover the sixth bonding pads 240, the fifth insulating layer 210a may be patterned to form fifth openings that expose the sixth bonding pads 240.

A third redistribution wiring 220a may be formed on the fifth insulating layer 210a to directly contact each of the sixth bonding pads 240 through the fifth openings. After a seed layer is formed on a portion of the fifth insulating layer 210a and in the fifth opening, the seed layer may be patterned and an electrolytic plating process may be performed to form a third redistribution wiring 220a. Accordingly, at least a portion of the third redistribution wiring 220a may directly contact each of the sixth bonding pads 240 through the fifth opening.

Then, after a sixth insulating layer 210b is formed on the fifth insulating layer 210a to cover the third redistribution wirings 220a, the sixth insulating layer 210b may be patterned to form a sixth opening that exposes the third redistribution wiring 220a. A fourth redistribution wiring 220b may be formed on the fifth insulating layer 210b to directly contacting the third redistribution wiring 220a through the sixth opening.

Then, after a seventh insulating layer 210c is formed on the sixth insulating layer 210b to cover the fourth redistribution wirings 220b, the seventh insulating layer 210c may be patterned to from a seventh opening that exposes the fourth redistribution wiring 220b. Fifth bonding pads 230 may be formed on the seventh insulating layer 210c to directly contact the fourth redistribution wirings 220b through the seventh openings.

Then, after an eighth insulating layer 210d is formed on the seventh insulating layer 210c to cover the fifth bonding pads 230, the eighth insulating layer 210d may be patterned to form an eighth opening that exposes the fifth bonding pad 230.

Figure 13:
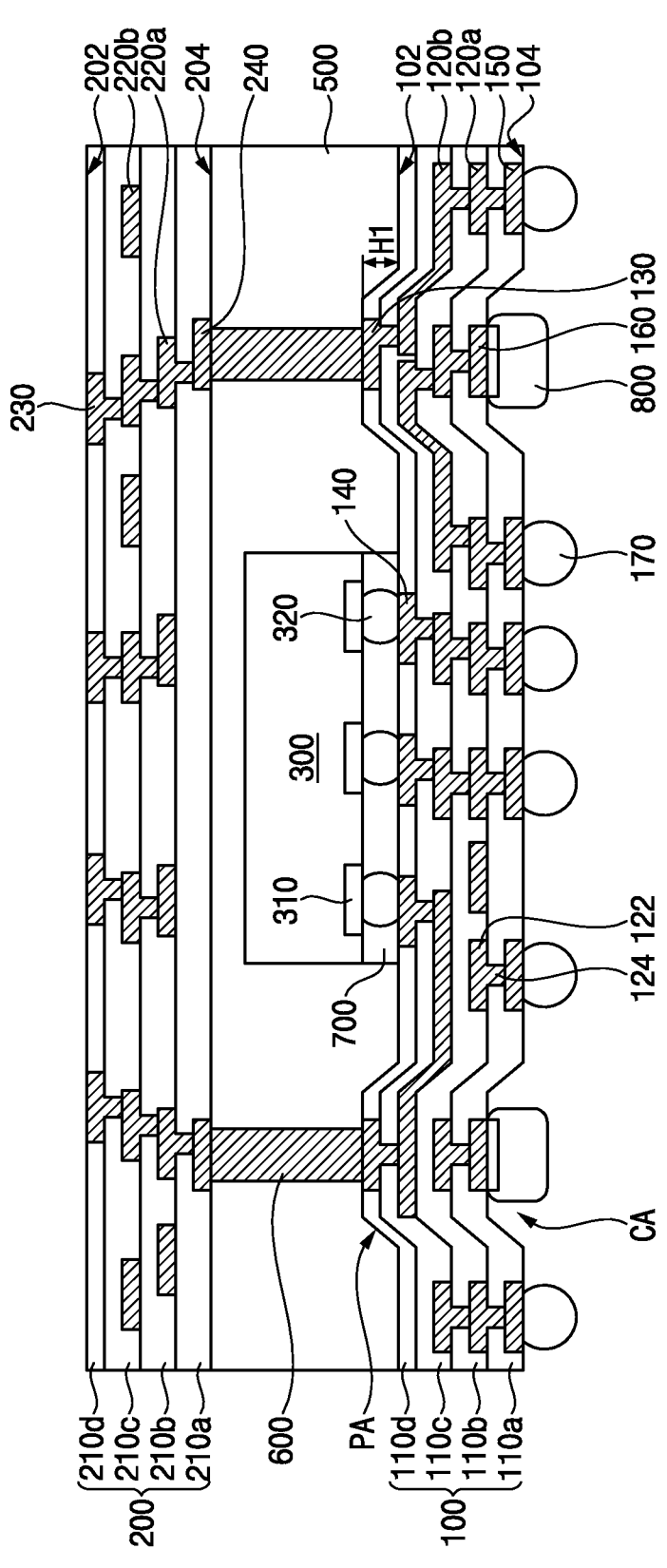

Referring to FIG. 13, solder bumps 170 may be formed on the third bonding pads 150 of the first redistribution wiring layer 100, and an electronic element 800 may be disposed on the fourth bonding pads 160.

First, the block layer, the release tape 20, and the barrier metal layer 22 may be removed from the second surface 104 of the first redistribution wiring layer 100. In a process of removing the block layer, the cavity CA may be formed in a space where the block BL is located. The fourth bonding pad 160 may be exposed from a bottom surface of the cavity CA.

The solder bumps 170 may be formed on the third bonding pads 150. In particular, after a fourth temporary opening of a fourth photoresist pattern is filled up with a conductive material, the fourth photoresist pattern may be removed and a reflow process may be performed to form a solder bump 170. For example, the conductive material may be formed by a plating process. Alternatively, the solder bumps 170 may be formed by a screen printing method, a deposition method, or the like. For example, the solder bumps 170 may include C4 bumps.

The electronic element 800 may be bonded to the fourth bonding pad 160. The electronic element 800 may be bonded to the fourth bonding pad 160 that is exposed from the bottom surface of the cavity CA. The electronic element 800 may be accommodated into the cavity CA from the second surface 104 of the first redistribution wiring layer 100. For example, the electronic element may perform various functions as a surface mount device. The electronic element may include, for example, one or more of an active device, a passive device, and a semiconductor chip.

Figure 14:
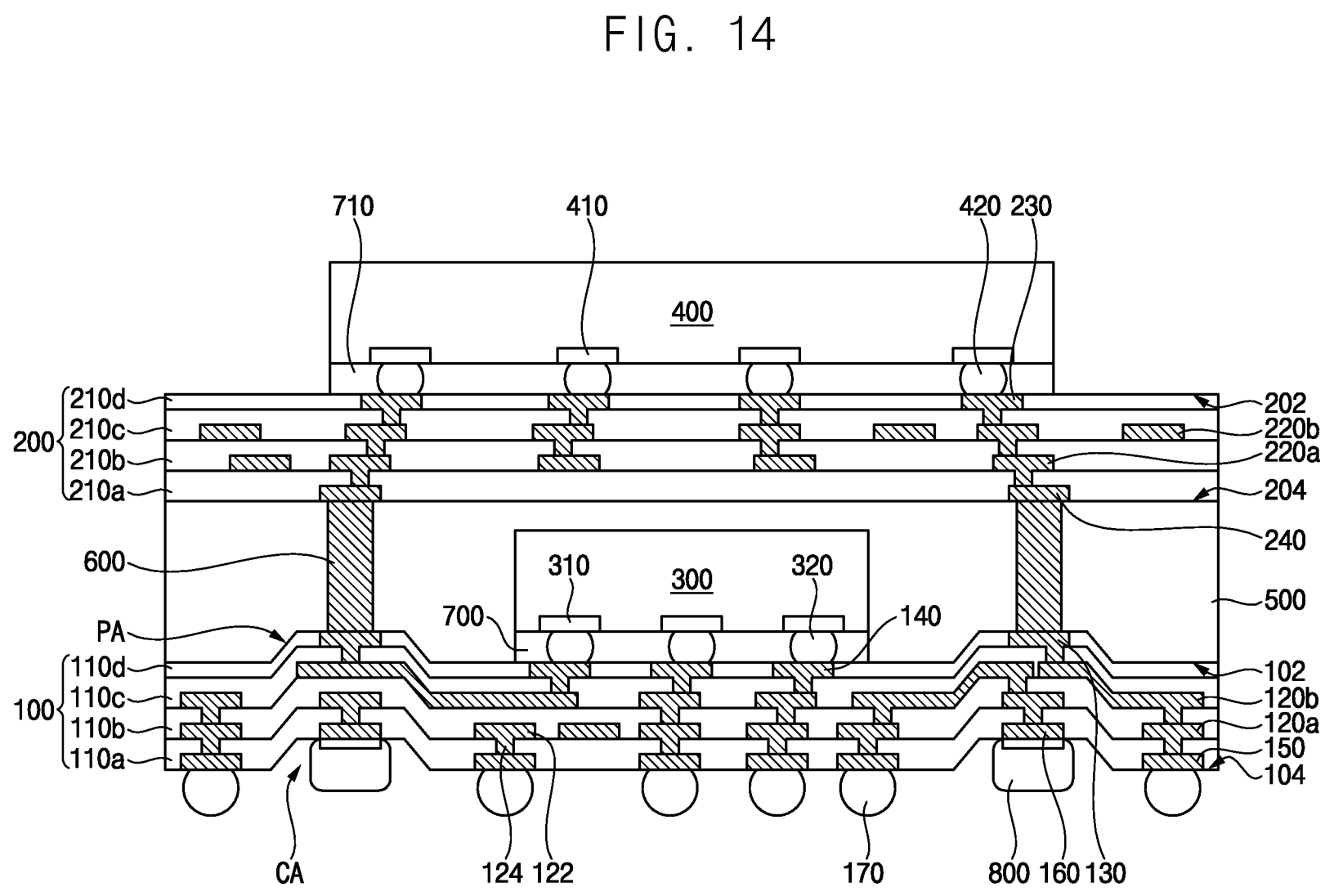

Referring to FIG. 14, processes the same as or similar to the processes described with reference to FIG. 10 may be performed to mount a second semiconductor device 400 on the second redistribution wiring layer 200, and then a second adhesive member 710 that underfills between the second redistribution wiring layer 200 and the second semiconductor device 400 may be formed.

In example embodiments, the second semiconductor device 400 may be mounted on the second redistribution wiring layer 200 by a flip chip bonding method. Second chip pads 410 of the second semiconductor device 400 may be electrically connected to the fifth bonding pads 230 of the second redistribution wiring layer 200 by second conductive bumps 420. For example, the second conductive bumps 420 may include micro bumps (uBumps).

Then, the semiconductor package 10 in FIG. 1 may be completed by injecting a second adhesive member 710 between the second redistribution wiring layer 200 and the second semiconductor device 400. For example, the second adhesive member 710 may include an epoxy material to reinforce a gap between the second redistribution wiring layer 200 and the second semiconductor device 400.

Figure 15:
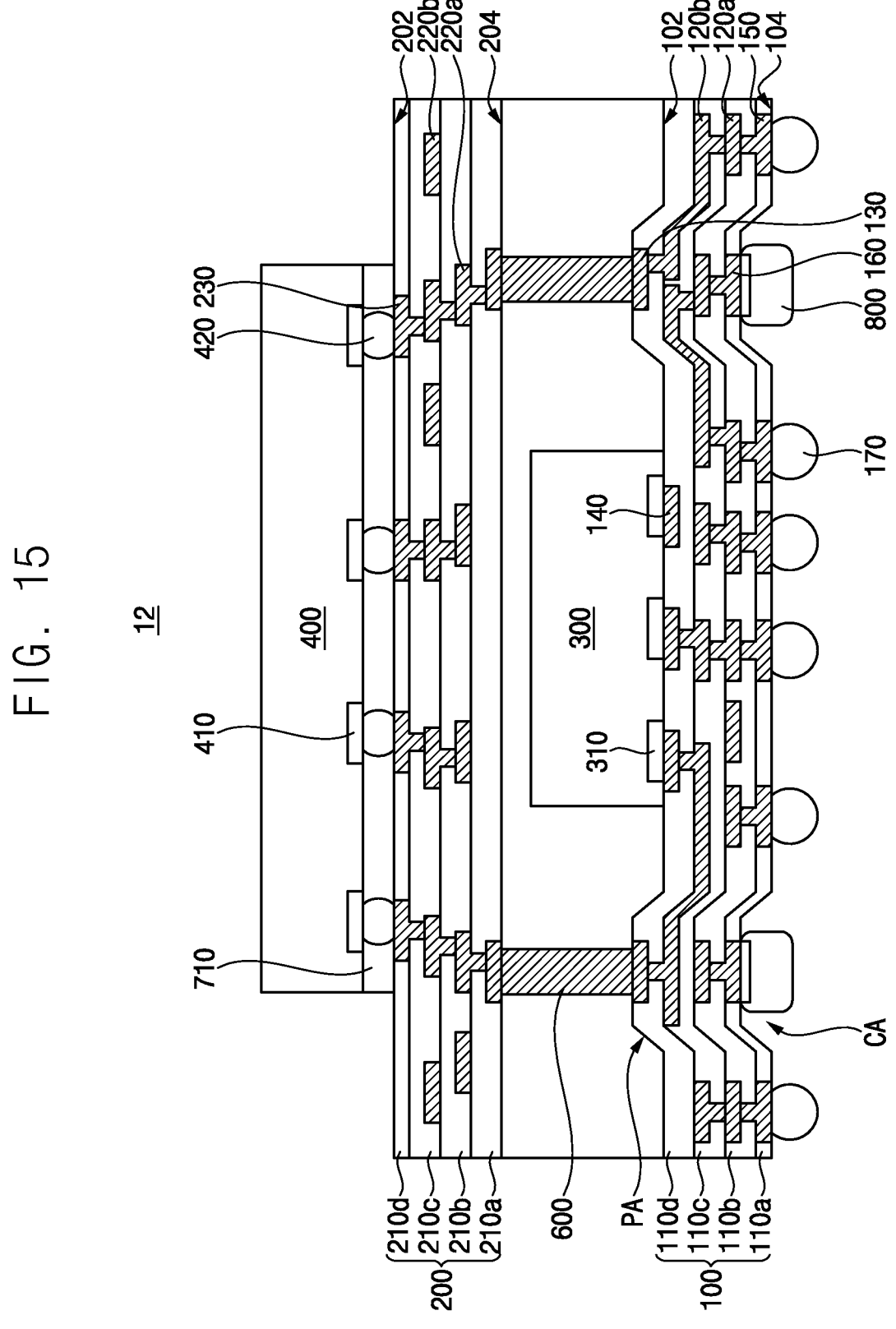
FIG. 15 is a plan view illustrating a semiconductor package having a modified redistribution wiring layer in accordance with example embodiments.

FIG. 15 is a plan view illustrating a semiconductor package having a modified redistribution wiring layer in accordance with example embodiments. The semiconductor package may be substantially the same as or similar to the semiconductor package described with reference to FIGS. 1 to 2 except for a configuration of the redistribution wiring layer. Thus, same or similar components are denoted by the same or similar reference numerals, and repeated descriptions of the same components may be omitted.

Referring to FIG. 15, a semiconductor package 12 may include the first and second redistribution wiring layers 100 and 200, the first semiconductor device 300 arranged on the first redistribution wiring layer 100, and the conductive structure 600 electrically connecting the first and second redistribution wiring layers 100 and 200 to each other. The semiconductor package 12 may further include the sealing member 500 on the first redistribution wiring layer 100 to cover the first semiconductor device 300, the second redistribution wiring layer 200 arranged on the sealing member 500, and the second semiconductor device 400 disposed on the second redistribution wiring layer 200.

In example embodiments, the first redistribution wiring layer 100 may include the plurality of first redistribution wirings 120a. The first redistribution wiring layer 100 may include the first and second surfaces 102, 104 opposite to each other. The first redistribution wiring layer 100 may include the protrusions PA protruding from the first surface 102 and the cavity CA provided in the second surface 104. The first redistribution wiring layer 100 may include the plurality of first and second bonding pads 130 and 140 provided to be exposed on the upper surface of the first redistribution wiring layer 100, that is, the first surface 102, and the plurality of third and fourth bonding pads 150 and 160 provided to be exposed on the lower surface, that is, the second surface 104 of the first redistribution wiring layer 100.

In example embodiments, the first redistribution wiring layer 100 may include the plurality of insulating layers 110a, 110b, 110c and 110d and the redistribution wirings 120a, 120b provided in the insulating layers. The redistribution wirings may include the first and second redistribution wirings 120a, 120b. The redistribution wirings 120a, 120b may electrically connect the first and second semiconductor devices 300, 400. At least some of the redistribution wirings may extend along the first surface 102 to have the curve in the thickness direction of the first redistribution wiring layer 100 at the protrusion PA or the cavity CA such that portions of a redistribution wiring are at varying heights.

The redistribution wirings may each include a redistribution via 124 provided in an opening penetrating the insulating layer, and a redistribution line 122 stacked on the redistribution via and extending along the upper surface of the insulating layer. For example, the redistribution via 124 may be provided on the redistribution line 122 toward the first surface 102 of the first redistribution wiring layer 100. For example, the semiconductor package 12 may include a chip first structure. The redistribution wiring may include aluminum (Al), copper (Cu), tin (Sn), nickel (Ni), gold (Au), platinum (Pt), or an alloy thereof.

Hereinafter, a method of manufacturing the semiconductor package in FIG. 15 will be described.

FIGS. 16 to 20 are cross-sectional views illustrating a method of manufacturing a semiconductor package in FIG. 15 in accordance with example embodiments.

Figure 16:
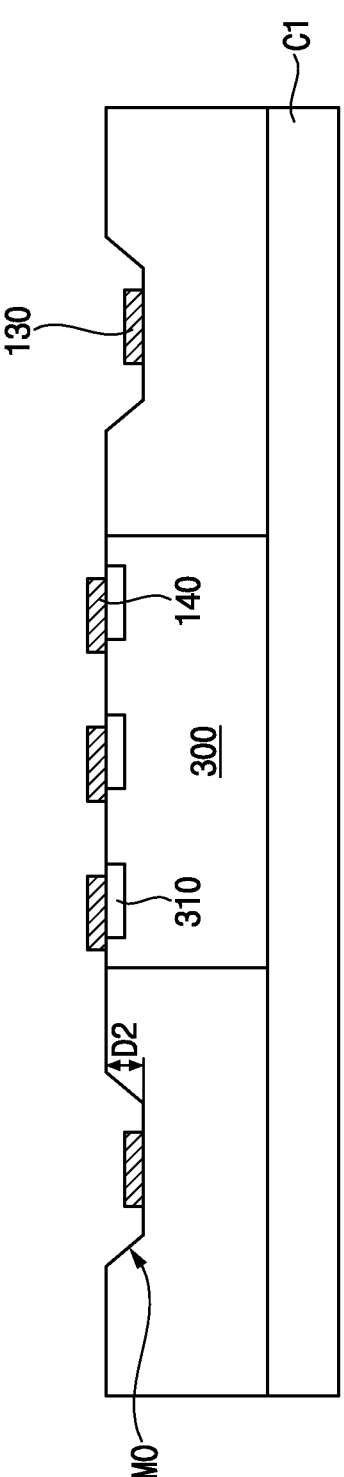

Referring to FIG. 16, a block layer and a first semiconductor device 300 may be provided on a carrier substrate C1.

The first semiconductor device 300 may be arranged on the carrier substrate C1. In this case, the first semiconductor device 300 may be arranged on the carrier substrate C1 such that an active surface on which first chip pads 310 are formed faces an opposite direction of the carrier substrate C1. Second bonding pads 140 may be formed on the first chip pads 310 of the first semiconductor device 300.

The block layer may include a plurality of mold portions MO. The mold portion MO may be recessed to a predetermined depth from an upper surface of the block layer. The mold portions MO may be formed at positions where the first bonding pads 130 for extending conductive structures 600 are to be provided on the carrier substrate C1. The mold portion MO may have a second depth D2. For example, the second depth D2 may be in a range of from 150 μm to 300 μm.

Then, an exposure process may be performed on a first photoresist film to form a first photoresist pattern having first temporary openings that expose regions of first and second bonding pads 130 and 140. Thereafter, a first plating process may be performed on the first photoresist pattern to form a first metal pattern. Then, the first photoresist pattern may be removed, and portions of the first metal pattern may be selectively removed to form the first and second bonding pads 130 and 140. The first bonding pad 130 may be formed on a lower surface of the mold portion MO, the second bonding pad 140 may be formed on the first chip pad 310 of the first semiconductor device 300.

Figure 17:
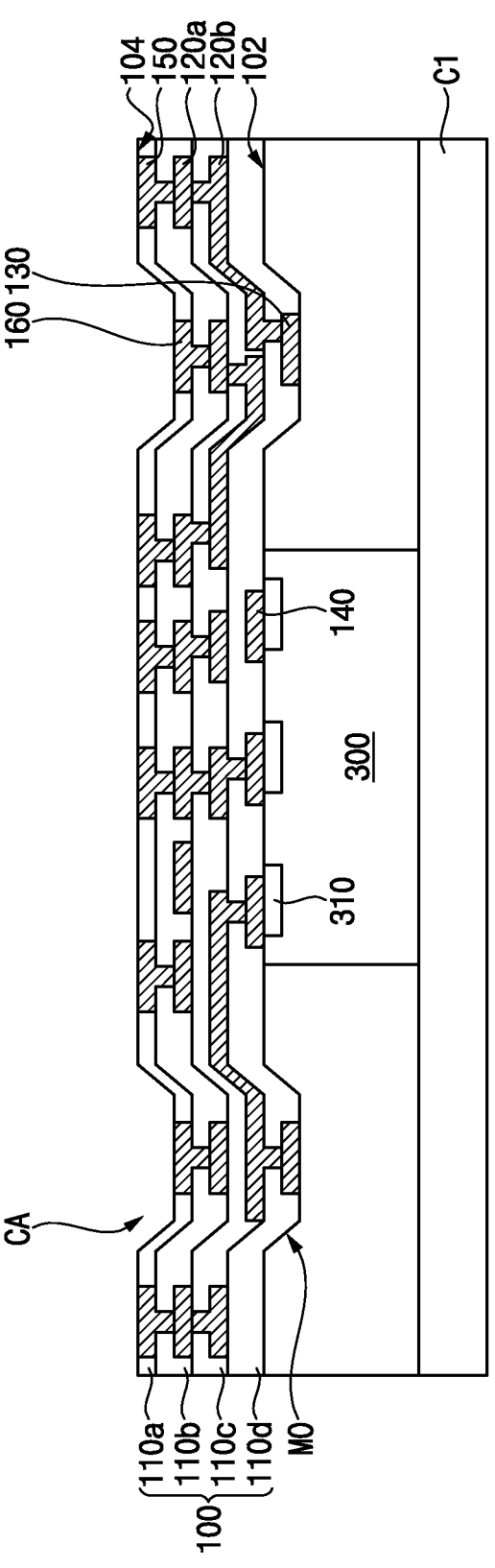

Referring to FIG. 17, a first redistribution wiring layer 100 having redistribution wirings 120a, 120b that are electrically connected to the first to fourth bonding pads 130, 140, 150, 160 may be formed.

First, after a fourth insulating layer 110d is formed on the block layer to cover the first and second bonding pads 130 and 140, the fourth insulating layer 110d may be patterned to from fourth openings that expose the first and second bonding pads 130 and 140. At least a portion of the fourth insulating layer 110d may be curved and extended by the mold portion MO.

For example, the fourth insulating layer 110d may include a polymer or a dielectric layer. In particular, the fourth insulating layer 110d may include polyimide (PI), lead oxide (PbO), polyhydroxystyrene (PHS), novolac, or the like. The fourth insulating layer 110d may be formed by a vapor deposition process, a spin coating process, or the like.

A second redistribution wiring 120b directly contacting the first and second bonding pads 130 and 140 may be formed on the fourth insulating layer 110d through the fourth openings. At least a portion of the second redistribution wiring 120b may extend with a curve formed by the mold portion MO.

After a seed layer is formed on a portion of the fourth insulating layer 110d and in the fourth opening, the seed layer may be patterned and an electrolytic plating process may be performed to form the second redistribution wiring 120b. Accordingly, at least a portion of the second redistribution wiring 120d may directly contact the first and second bonding pads 130 and 140 through the fourth opening.

For example, the second redistribution wiring may include aluminum (Al), copper (Cu), tin (Sn), nickel (Ni), gold (Au), platinum (Pt), or an alloy thereof.

Then, after a third insulating layer 110c is formed on the fourth insulating layer 110d to cover the second redistribution wirings 120b, the third insulating layer 110c may be patterned to from a third opening that expose the second redistribution wirings 120b. A first redistribution wiring 120a may be formed on the third insulating layer 110c to directly contact the second redistribution wiring 120b through the third openings. At least a portion of the third insulating layer 110c may extend with the curve formed by the mold portion MO. At least a portion of the first redistribution wiring 120a may extend with the curve formed by the mold portion MO.

Then, after a second insulating layer 110b is formed on the third insulating layer 110c to cover the first redistribution wirings 120a, the second insulating layer 110b may be patterned to from a second opening that expose the first redistribution wirings 120a. The third and fourth bonding pads 150 and 160 may be formed on the third insulating layer 110c to directly contact the first redistribution wirings 120a through the second openings.

A protrusion PA may be formed on the first surface 102 of the first redistribution wiring layer 100 by the mold portion MO. A cavity CA may be formed on the second surface 104 of the first redistribution wiring layer 100 by the mold portion MO.

Then, after a first insulating layer 110a is formed on the second insulating layer 110b to cover the third and fourth bonding pads 150 and 160, the first insulating layer 110a may be patterned to from first openings that expose the third and fourth bonding pads 150 and 160.

Figure 18:
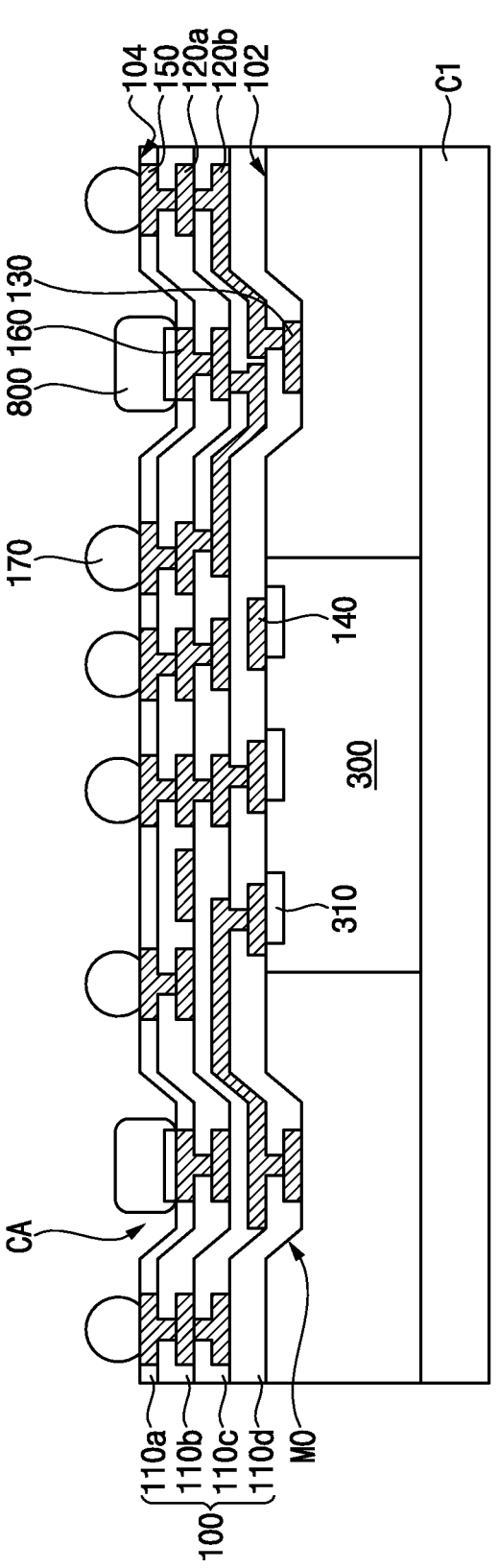

Referring to FIG. 18, solder bumps 170 may be formed on the third bonding pads 150 of the first redistribution wiring layer 100, and an electronic element 800 may be disposed on the fourth bonding pads 160.

In example embodiments, the solder bumps 170 may be formed on the third bonding pads 150. The solder bumps 170 may be formed by a plating process, a screen printing method, a deposition method, or the like. For example, the solder bumps 170 may include C4 bumps.

In example embodiments, the electronic element 800 may be bonded to the fourth bonding pad 160. The electronic element 800 may be bonded to the fourth bonding pad 160 that is exposed from a bottom surface of the cavity CA. The electronic element 800 may be accommodated into the cavity CA recessed from the second surface 104 of the first redistribution wiring layer 100. For example, the electronic element may perform various functions as a surface mount device. The electronic element may include, for example, at least one of an active device, a passive device, and a semiconductor chip.

Figure 19:
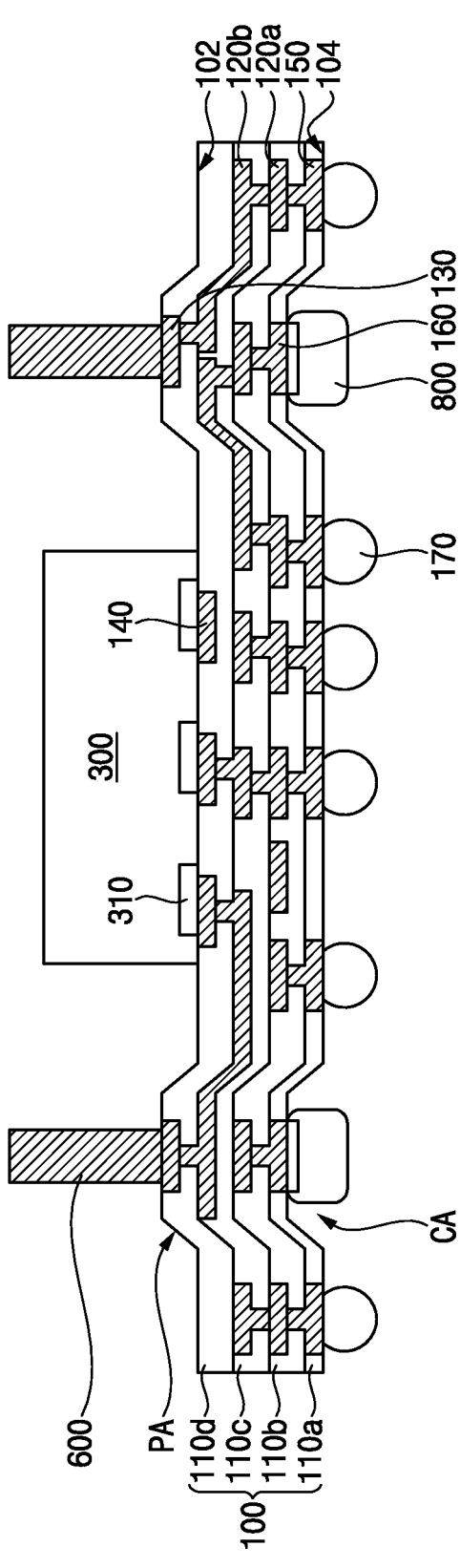

Referring to FIG. 19, the conductive structures 600 may be formed on the first redistribution wiring layer 100 by performing processes identical to or similar to those described with reference to FIGS. 6 to 9.

First, a second photoresist film 50 may cover the first surface 102 of the first redistribution wiring layer 100. Then, an exposure process may be performed on the second photoresist film 50 to form through openings 32 that expose each of the first bonding pads 130. The conductive structures 600 may be formed to fill the through openings 32 that penetrate the second photoresist film 50 in a vertical direction. The through openings 32 may be filled up with conductive material by a second plating process to form the conductive structures 600.

Then, the second photoresist film 50 may be removed to form the conductive structures 600 that extend from the first bonding pads 130, respectively.

Figure 20:
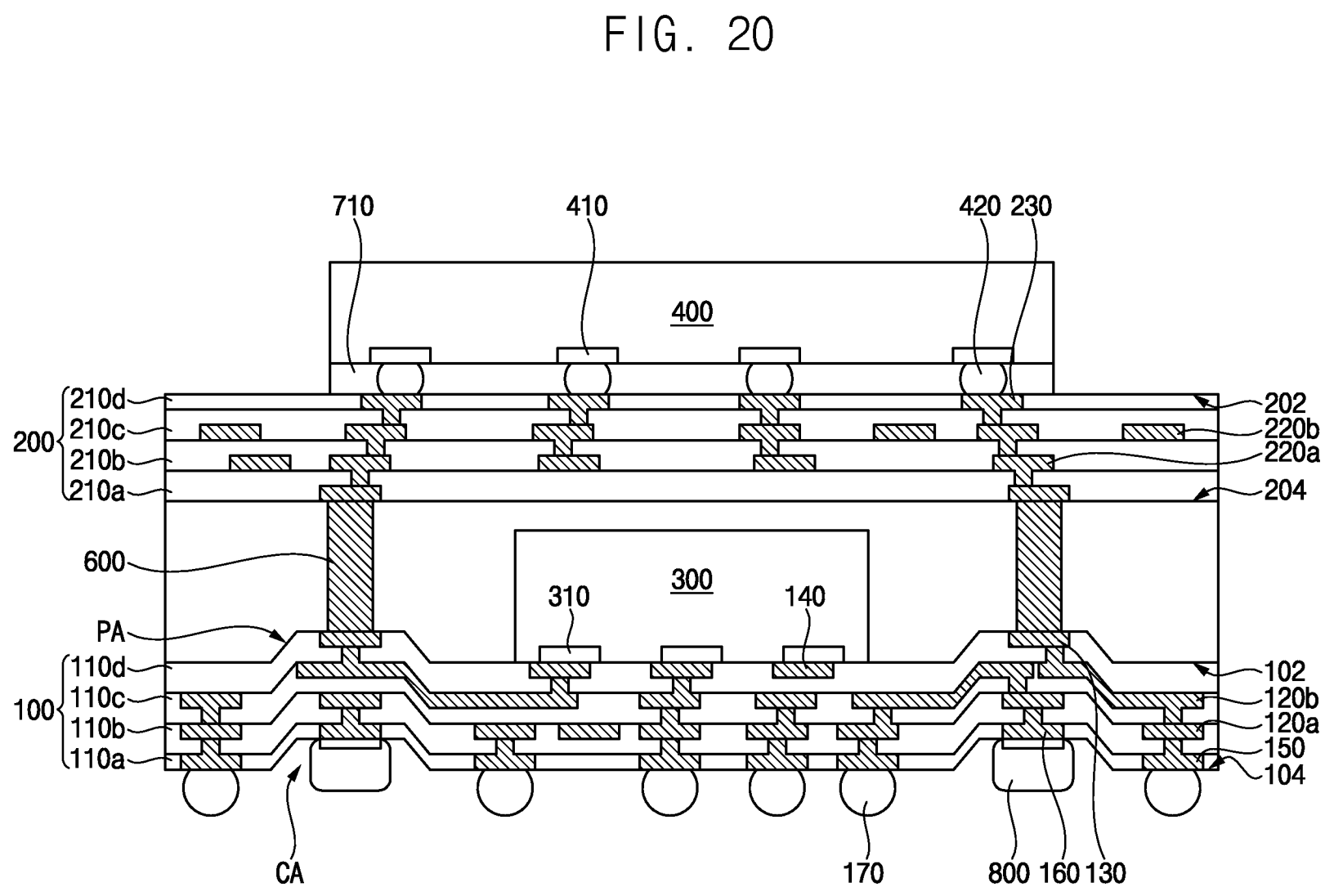

Referring to FIG. 20, a sealing member 500 may be formed to cover the first semiconductor device 300 and the conductive structures 600, a second redistribution wiring layer 200 is formed on the sealing member 500, and processes the same as or similar to the processes described with reference to FIGS. 10 to 14 may be performed to mount a second semiconductor device 400 on the second redistribution wiring layer 200.

For example, the sealing member 500 may include an epoxy molding compound (EMC). The sealing member 500 may be formed to expose an upper surface of the conductive structure 600.

Then, the second redistribution wiring layer 200 having fifth to eighth insulating layers 210a, 210b, 210c, 210d and third and fourth redistribution wirings 220a, 220b may be formed on the sealing member 500. The fifth bonding pads 230 may be electrically connected to the conductive structure 600. The sixth bonding pads 240 may be exposed from a third surface 202 of the second redistribution wiring layer 200.

Then, after the second semiconductor device 400 is mounted on the second redistribution wiring layer 200, a second adhesive member 710 may be formed to underfill between the second redistribution wiring layer 200 and the second semiconductor device 400.

In example embodiments, the second semiconductor device may be mounted on the second redistribution wiring layer 200 by a flip chip bonding method. Second chip pads 410 of the second semiconductor device 400 may be electrically connected to the fifth bonding pads 230 of the second redistribution wiring layer 200 by second conductive bumps 420. For example, the second conductive bumps 420 may include micro bumps (uBumps).

Then, the semiconductor package 12 in FIG. 15 may be completed by injecting a second adhesive member 710 between the second redistribution wiring layer 200 and the second semiconductor device 400. For example, the second adhesive member 710 may include an epoxy material to reinforce a gap between the second redistribution wiring layer 200 and the second semiconductor device 400.

While aspects of example embodiments have been particularly shown and described, it will be understood that various changes in form and details may be made therein without departing from the spirit and scope of the following claims.

What is claimed is:

1. A semiconductor package, comprising:
a first redistribution wiring layer having a first surface and a second surface opposite to the first surface, the first redistribution wiring layer comprising protrusions protruding from the first surface and a plurality of first bonding pads provided on the protrusions, the first redistribution wiring layer comprising a plurality of insulating layers in which each insulating layer has a shape correspond to a shape of the protrusions;
a first semiconductor device mounted on the first redistribution wiring layer via conductive bumps;
a plurality of conductive structures respectively extending from the plurality of first bonding pads around the first semiconductor device; and
a second redistribution wiring layer disposed on the plurality of conductive structures and electrically connected to the first redistribution wiring layer.

2. The semiconductor package of claim 1, wherein a height of the plurality of conductive structures is in a range of from 50 μm to 200 μm.

3. The semiconductor package of claim 1, further comprising:
a second semiconductor device on the second redistribution wiring layer.

4. The semiconductor package of claim 1, further comprising:
a molding member between the first redistribution wiring layer and the second redistribution wiring layer, and provided on the first semiconductor device and the plurality of conductive structures.

5. The semiconductor package of claim 1, wherein the protrusions protrude from the first surface to a predetermined height, and

wherein the predetermined height is in a range of from 150 μm to 300 μm.

6. The semiconductor package of claim 1, wherein the first redistribution wiring layer comprises at least one cavity provided on the second surface.

7. The semiconductor package of claim 6, wherein the first redistribution wiring layer further comprises a second bonding pad exposed from a bottom surface of the at least one cavity, and wherein the semiconductor package further comprises a passive element bonded to the second bonding pad and electrically connected to the first redistribution wiring layer.

8. The semiconductor package of claim 1, wherein the first redistribution wiring layer further comprises a plurality of redistribution wirings electrically connecting the first semiconductor device and the plurality of conductive structures, and wherein the plurality of redistribution wirings comprise a redistribution via and a redistribution line on the redistribution via.

9. The semiconductor package of claim 8, wherein a first bonding pad from the plurality of first bonding pads is provided on the redistribution line.

10. The semiconductor package of claim 8, wherein a first bonding pad from the plurality of first bonding pads is provided on the redistribution via.

11. The semiconductor package of claim 8, wherein at least one of the plurality of redistribution wirings extends on the first surface to varying heights in a thickness direction of the first redistribution wiring layer at the protrusions.

12. The semiconductor package of claim 8, wherein the plurality of conductive structures comprise at least one of nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), and tin (Sn).

13. A method of manufacturing a semiconductor package, the method comprising:

forming insulating layers and redistribution wirings on a block layer to form a first redistribution wiring layer comprising protrusions protruding upward, the first redistribution wiring layer comprising a plurality of insulating layers in which each insulating layer has a shape correspond to a shape of the protrusions;

providing a plurality of first bonding pads on the protrusions;

forming a plurality of conductive structures that extend from the plurality of first bonding pads, respectively;

disposing a first semiconductor device on the first redistribution wiring layer via conductive bumps;

forming a molding member on the first semiconductor device and at least one conductive structure from among the plurality of conductive structures; and forming a second redistribution wiring layer on the molding member to be electrically connected to end portions of the plurality of conductive structures exposed from the molding member.

14. The method of claim 13, wherein forming the plurality of conductive structures further comprises forming the plurality of conductive structures to extend to a predetermined height, and wherein the predetermined height is in a range of from 50 μm to 200 μm.

15. The method of claim 13, wherein forming the first redistribution wiring layer comprises forming the protrusions to protrude to a predetermined height, and wherein the predetermined height is in a range of from 150 μm to 300 μm.

16. The method of claim 13, the method further comprising:

disposing a second semiconductor device on the second redistribution wiring layer so as to be electrically connected to the first semiconductor device through the plurality of conductive structures.

17. The method of claim 13, the method further comprising:

removing the block layer from the first redistribution wiring layer.

18. The method of claim 13, wherein forming the first redistribution wiring layer further comprises disposing a second bonding pad on the block layer to be exposed from the first redistribution wiring layer.

19. The method of claim 18, further comprising:

bonding a passive element on the second bonding pad to electrically connect to the first semiconductor device.

20. A semiconductor package, comprising:

a first redistribution wiring layer having a first surface and a second surface opposite to the first surface, the first redistribution wiring layer comprising first bonding pads provided in a chip mounting region of the first surface, protrusions protruding from the first surface in an outer region around the chip mounting region, and second bonding pads respectively provided on upper surfaces of the protrusions, the first redistribution wiring layer comprising a plurality of insulating layers in which each insulating layer has a shape correspond to a shape of the protrusions;

a first semiconductor device disposed on the chip mounting region on the first redistribution wiring layer, the first semiconductor device mounted via conductive bumps that are disposed on the first bonding pads;

a sealing member on the first surface of the first redistribution wiring layer and disposed on the first semiconductor device;

a plurality of conductive structures respectively extending from the second bonding pads to penetrate the sealing member; and a second redistribution wiring layer disposed on the sealing member, the second redistribution wiring layer electrically connected to the plurality of conductive structures.

* * * * *